United States Patent

Nakajima et al.

Patent Number: 6,054,349
Date of Patent: Apr. 25, 2000

[54] SINGLE-ELECTRON DEVICE INCLUDING THEREIN NANOCRYSTALS

[75] Inventors: Anri Nakajima; Naoto Horiguchi; Hiroshi Nakao, all of Kawasaki, Japan

[73] Assignee: Fujitsu Limited, Kawasaki, Japan

[21] Appl. No.: 09/095,883

[22] Filed: Jun. 11, 1998

[30] Foreign Application Priority Data

Jun. 12, 1997 [JP] Japan ................................. 9-155285

[51] Int. Cl.$^7$ ................................................ H01L 21/336
[52] U.S. Cl. .................... 438/257; 438/264; 438/301; 438/962; 257/315; 257/316
[58] Field of Search ................................. 257/315, 316, 257/321; 438/301, 257, 264, 962

[56] References Cited

U.S. PATENT DOCUMENTS 5,852,306  12/1998  Forbes .
5,852,346  12/1998  Komoda et al. .
5,923,046   7/1999  Tezuka et al. .

OTHER PUBLICATIONS

Welser, J.J., et al, Room Temperature Operation of a Quantum–Dot Flash Memory, IEEE Elect. Dev. Lett., vol. 18, No. 6, ppg. 278–280, Jun. 1997.

Nakajima, et al, "Single electron charging of Sn nanocystals in thin SiO2 film formed by low energy ion implantation," IEEE IEDM ppg. 159–162, 1997.

Guo et al, Si single electron MOS memory with nanoscale floating–gate and narrow channel, IEEE IEDM ppg. 955–956, 1996.

Yano et al, "Room–temperature single electron memory," IEEE Trans. on Elect. Dev. vol. 41, No. 9, ppg. 1628–1638, Sep. 1994.

Magruder et al, "Formation and optical characterization of nanometer dimension colloids in silica formed by sequentially implanting In and Ag," J. Appl. Phys. 77 (7) ppg 3546–3548, Apr. 1, 1995.

G.W. Arnold et al; Journal of Applied Physics, vol. 48, No. 4, Apr. 1977.

K.Fukumi et al; Japanese Journal of Applied Physics, vol. 30, No. 4B, Apr. 1991.

M. R. Tuzzolo et al; Journal of Non–Crystalline Solids 143(1992) 181–190.

R. H. Magruder III et al; J. Appl. Phys. 77(7), Apr. 1, 1995.

J.G. Zhu et al; J. Apl. Phys. 78(7), Oct. 1, 1995.

H. Hosono et al; Journal of Non–Crystalline Solids 143 (1992) 157–161.

*Primary Examiner*—John F. Niebling
*Assistant Examiner*—Jonathan Hack
*Attorney, Agent, or Firm*—Armstrong, Westerman, Hattori, McLeland & Naughton

[57] ABSTRACT

A single-electron device includes a substrate, an insulating film provided on the substrate, a plurality of nanometer-size conductive particles formed in the insulating film along an interface between the substrate and the insulating film, and an electrode provided on the insulating film, wherein the conductive particles have a generally identical size and arranged substantially in a plane at a depth closer to the substrate.

13 Claims, 17 Drawing Sheets

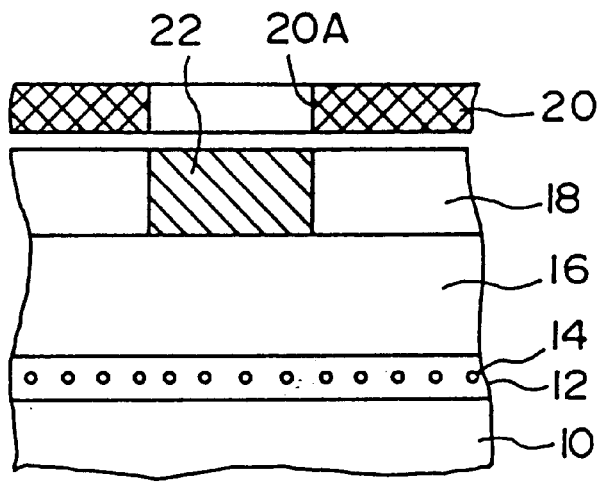
FIG. 6E
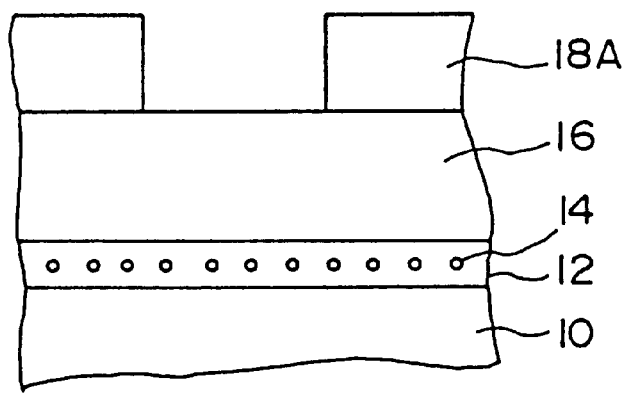
FIG. 6F
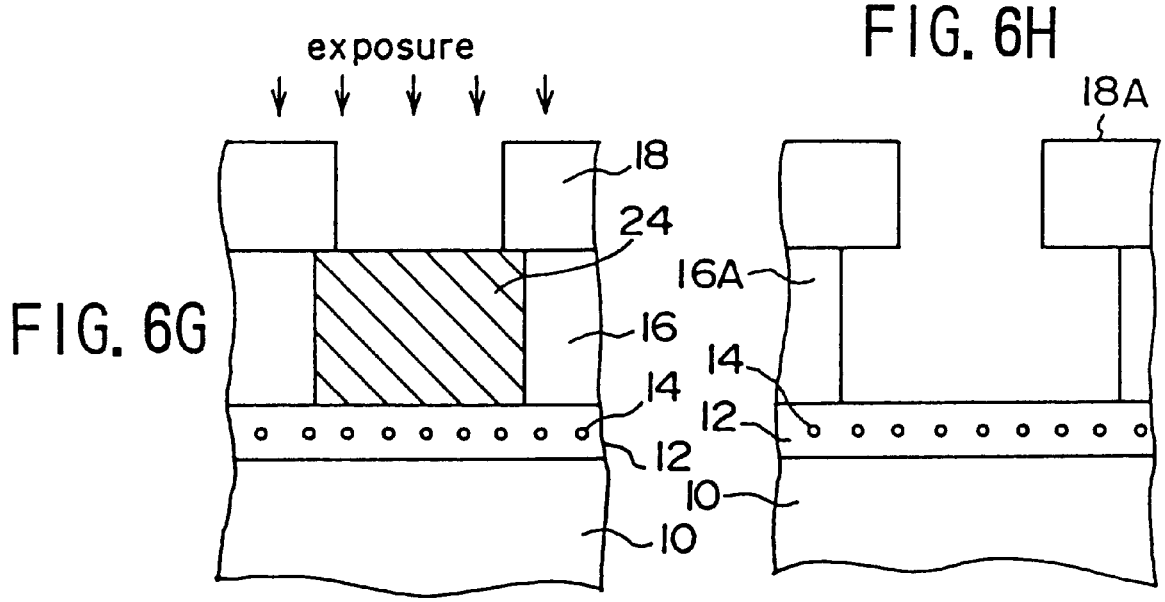
FIG. 6G
FIG. 6H

SINGLE-ELECTRON DEVICE INCLUDING THEREIN NANOCRYSTALS

BACKGROUND OF THE INVENTION

The present invention generally relates to electron devices and more particularly to a single-electron device including ultra-fine conductive particles or so-called nanocrystals dispersed in an insulating film and a fabrication process thereof.

Since the discovery of quantized, stepwise change of conductance in a system of ultra-fine metal particles dispersed in an oxide film by Wilkins, et al. (Wilkins, R., Ben-Jacob, E., Jaklevic, R. C., Phys. Rev. Lett. 63, 1989, pp.801), intensive investigations are being made on a so-called single-electron device that uses the phenomenon of Coulomb blockade of electron. By using the Coulomb blockade of electron, it becomes possible to construct a device that achieves a switching operation based upon a single electron effect that appears in a tunnel current flowing through a very small capacitance. Further, it becomes possible to construct various logic circuits or memory circuits by using such single-electron devices.

FIGS. 1A and 1B show a basic component of a single-electron device.

Referring to FIG. 1A showing a tunnel junction, the charging energy E of the tunnel junction is given by $$E = Q^2/2C$$

where C represents the capacitance of the tunnel junction and Q represents the electric charge accumulated in the tunnel junction.

When a single electron has caused a tunneling through the tunnel junction from one electrode to the other electrode, the accumulated electric charge is decreased from Q to Q−e, and the energy of the tunnel junction is changed by $$_\Delta E = e(Q_c - Q)/C$$

where $Q_c$ is a critical electric charge and is given by $e/2 (Q_c = e/2)$.

Thus, when the electric charge Q accumulated in the tunnel junction is smaller than the foregoing critical charge $Q_c$, such a tunneling increases the energy of the junction ($_\Delta E > 0$) and the tunneling is blocked.

When a voltage larger than e/2C is applied across the tunnel junction, on the other hand, Q becomes larger than $Q_c$. Therefore, the tunneling of the electron is facilitated because $_\Delta E < 0$.

FIG. 1B shows the operational characteristics (I-V characteristic) of the tunnel junction. The curve of FIG. 1B clearly indicates a blocking region of current, which arises due to the foregoing single electron effect.

In order that such a single electron effect is observed in a tunnel junction, it is necessary that the energy change $_\Delta E$ ($\approx e^2/2C$), which a single electron experiences when tunneling through the junction, has to have a value exceedingly larger than a thermal excitation energy $k_B T$ ($e^2/2C > k_B T$) where $k_B$ is Boltzmann's constant and T is the absolute temperature. In order to achieve the foregoing condition, it is necessary to form the tunnel junction such that the tunnel junction has a very small capacitance.

As the formation of such an extremely minute capacitor is difficult by a conventional patterning process, there have been proposals and trials to realize a minute capacitor by forming a so-called nanocrystal structure in the form of ultra-fine metal particles (metal nanocrystals) typically having a diameter of 10 nm or less. The metal particles are distributed in an insulating film such as an $SiO_2$ film in a state that the metal particles are arranged substantially two-dimensionally with a generally identical mutual separation.

Conventionally, such a formation of the desired nanocrystal structure has been attempted by depositing ultra-fine metal particles on an insulating film by way of a sputtering or vapor phase deposition process. However, such a conventional process has been unsuccessful to form the desired metal nanocrystals, which should have a generally uniform size, isolated from each other in the insulating film, and arranged two-dimensionally in a substantially common plane in the insulating film.

On the other hand, there is a proposal to use an ion implantation process for introducing the metal elements into an insulating film for forming the metal nanocrystals in such an insulating film. According to such a process, it is possible to form the metal nanocrystals in the insulating film in the state that the metal nanocrystals are isolated from each other. See for example Hosono, et al. (Hosono, H., et al., "Cross-sectional TEM Observation of Copper-implanted $SiO_2$ Glass," J. Non-crystalline Solids, 143, 1992, pp.157–161).

The foregoing prior art reports a successful formation of ultra-fine Cu particles in an $SiO_2$ film by introducing Cu atoms into the $SiO_2$ film by an ion implantation, first by setting the acceleration energy to 160 keV and conducting the ion implantation process with the dose to $6 \times 10^{16}$ cm$^{-2}$, followed by setting the acceleration energy to 35 keV and conducting the ion implantation process with the dose to $2 \times 10^{16}$ cm$^{-2}$.

However, the metal nanocrystal structure thus obtained by the foregoing prior art process shows a wide scattering of the metal nanocrystals in the depth direction of the $SiO_2$ film, and the structure desired for a single electron device is not obtained. It should be noted that the electron has to cause a tunneling in series in such a structure when an electric field is applied across the $SiO_2$ film. Further, the characteristic of FIG. 1B tends to change in the depth direction of the insulating film in such a scattered structure, and the observation of a clear characteristic is not possible.

In order to realize a single-electron device, it is necessary to form the metal nanocrystals in the insulating film such that the metal nanocrystals have a generally identical size and are isolated from each other with a generally uniform mutual separation. Further, the metal nanocrystals have to be arranged generally two-dimensionally in the insulating film in a more or less common plane.

SUMMARY OF THE INVENTION

Accordingly, it is a general object of the present invention to provide a novel and useful single-electron device and a fabrication process thereof wherein the foregoing problems are eliminated.

Another and more specific object of the present invention is to provide a single-electron device including metal nanocrystals having a nanometer size in an insulating film such that the metal nanocrystals have a generally uniform size and arranged in the insulating film at a predetermined depth generally two-dimensionally with a generally uniform mutual separation.

Another object of the present invention is to provide a single-electron device, comprising:

a substrate;

an insulating film provided on said substrate;

a plurality of conductive particles formed in said insulating film along an interface between said substrate and said insulating film, each of said conductive particles having a nanometer size; and an electrode provided on said insulating film;

wherein said conductive particles have a generally identical size and arranged substantially in a plane at a depth closer to said substrate.

Another object of the present invention is to provide a method of fabricating a single-electron device, comprising the steps of:

introducing metal atoms into an insulating film provided on a substrate; and causing a diffusion of said metal atoms in said insulating film so as to precipitate ultra-fine metal particles having a nanometer size in said insulating film along an interface between said insulating film and said substrate in a state that said metal particles are isolated from each other;

wherein said step of introducing metal atoms is conducted such that a concentration level of said metal atoms is substantially zero in said substrate including said interface.

According to the present invention, the metal atoms, introduced into the insulating film in such a manner that the metal atoms do not reach the substrate, are concentrated in a part of the insulating film adjacent to the substrate where a strain is accumulated immediately after the step of introducing the metal atoms. By annealing such a structure at a high temperature, a structure is obtained in which metal nanocrystals having a generally identical size are arranged in the insulating film at a generally constant height as measured from the interface between the insulating film and the substrate. Particularly, by employing an ion implantation process in the step of introducing the metal atoms and by setting the acceleration energy thereof to a low energy level, the metal ions do not reach the substrate, and the distribution of the metal atoms in the insulating film prior to the high temperature annealing process is substantially improved such that the metal atoms are concentrated to a particular depth of the insulating film. By conducting a high temperature annealing process, the metal atoms precipitate spontaneously after diffusion, and the desired metal nanocrystals having a generally identical size are formed in such a manner that the metal nanocrystals are arranged in the insulating film at a generally constant height as measured from the interface between the insulating film and the substrate. In the insulating film, the metal nanocrystals thus formed are separated by a generally identical distance.

Other objects and further features of the present invention will become apparent from the following detailed description when read in conjunction with the attached drawings.

BRIEF DESCRIPTION OF THE DRAWINGS

FIGS. 6A–6J are diagrams showing the fabrication process of a single-electron tunneling diode according to a first embodiment of the present invention;

DETAILED DESCRIPTION OF THE PREFERRED EMBODIMENTS

[PRINCIPLE]

Figure 2:
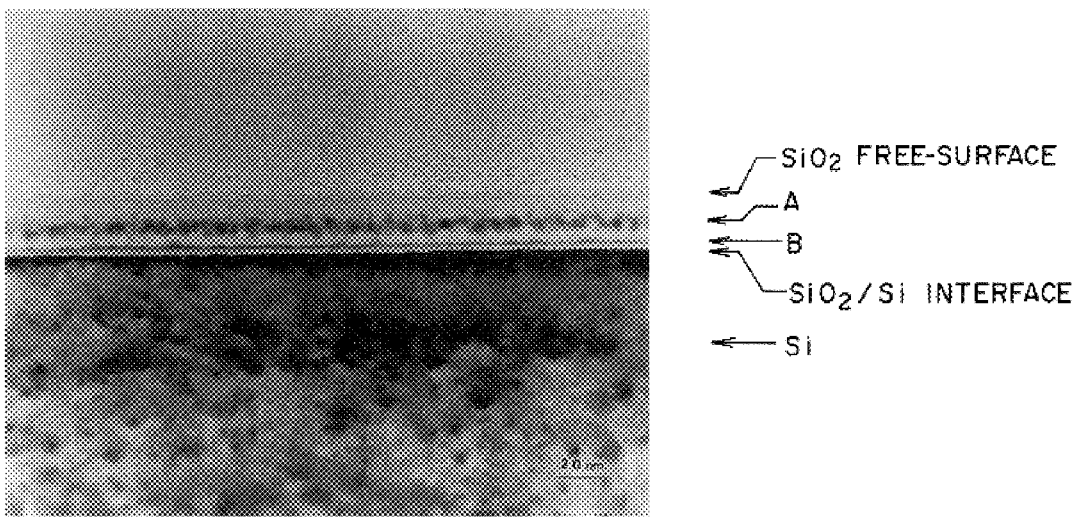
FIG. 2 is a diagram explaining the principle of the present invention.

FIG. 2 shows a TEM photograph of a thermally oxidized $SiO_2$ film formed on a degenerate Si substrate having an n+-type with a thickness of about 15 nm, in which Sn atoms are introduced by an ion implantation process conducted under an acceleration energy of 10 keV with a dose of $5 \times 10^{15}$ cm$^{-2}$. FIG. 2 shows the state immediately after the ion implantation process.

Figure 3:
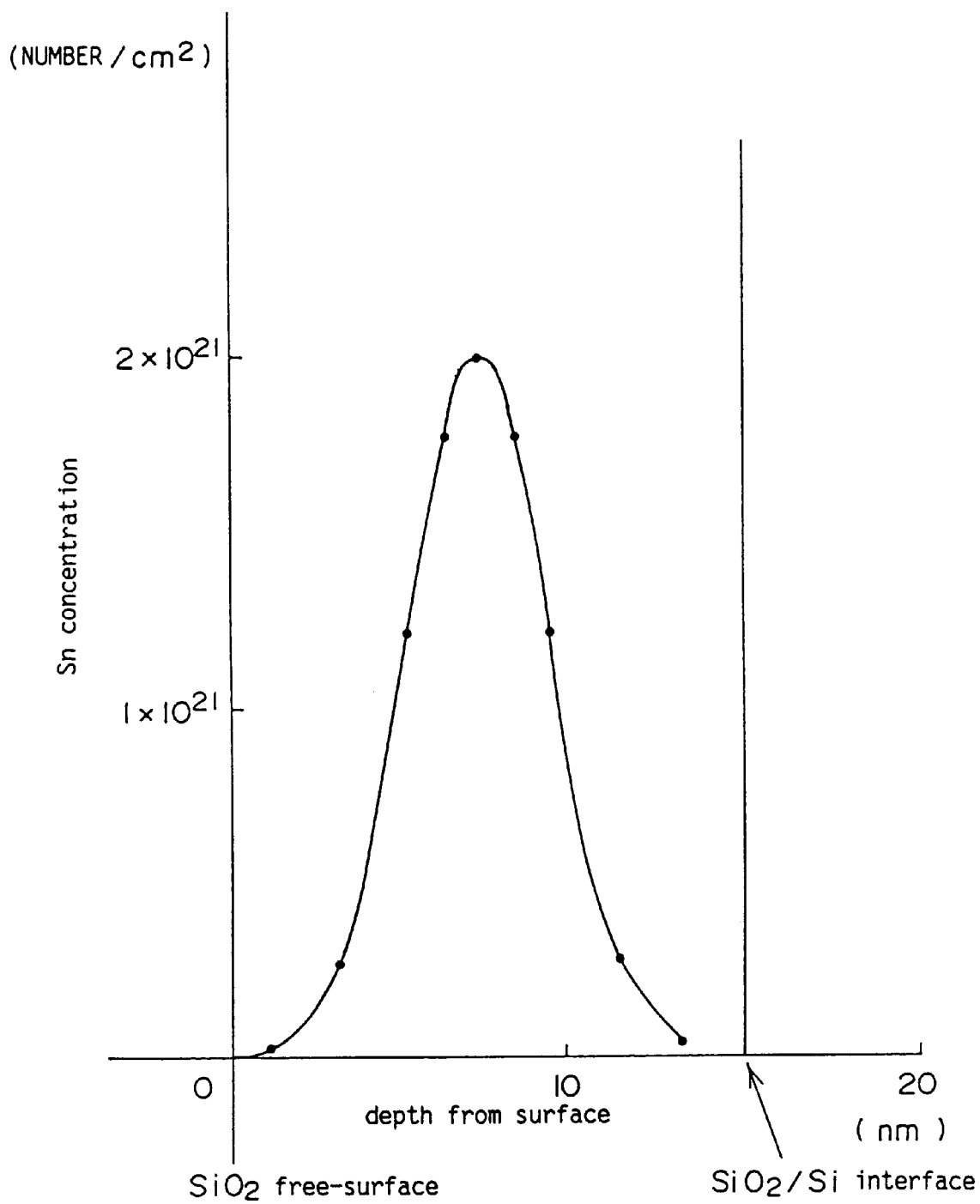
FIG. 3 is another diagram explaining the principle of the present invention.

Referring to FIG. 2, it can be seen that the Sn atoms, introduced with such a low acceleration energy, are concentrated generally at a middle depth level A of the thermal oxide film. The Sn distribution profile shown in FIG. 3 also confirms the observation of FIG. 2, wherein the distribution profile of FIG. 3 represents the distribution of the Sn ions in the thermal oxide film in the state immediately after the ion implantation process, similarly to the TEM photograph of FIG. 2. FIG. 3 further indicates that there are no substantial Sn atoms that reach the Si substrate or to the interface between the Si substrate and the thermal oxide film.

Further, it is noted that the TEM photograph of FIG. 2 shows another sharp concentration of Sn atoms in the thermal oxide film at a level B closer to the Si substrate as compared with the foregoing level A. This concentration of the Sn atoms at the foregoing level B suggests the existence of a strain in the thermal oxide film adjacent to the foregoing interface and a capturing of the Sn atoms in such a strained region.

Figure 4:
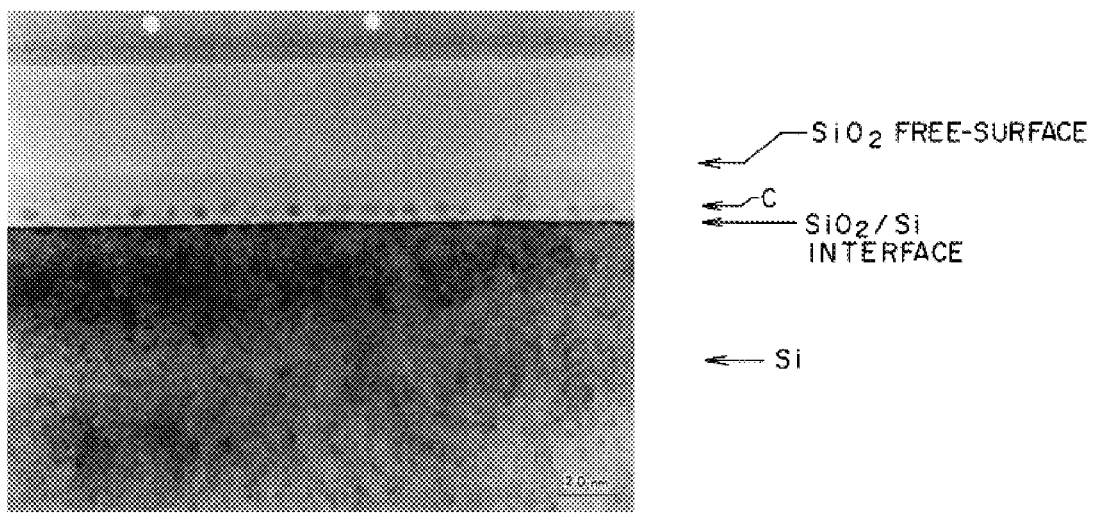
FIG. 4 is another diagram explaining the principle of the present invention.

FIG. 4 shows a TEM photograph of the foregoing structure of FIG. 2 after an annealing process conducted at a temperature of about 900° C. for a duration of about 10 minutes.

Referring to FIG. 4, it can be seen that the major concentration of the Sn atoms at the central level A of the thermal oxide film, observed in the TEM photograph of FIG. 2, has now disappeared and there occurs a concentration of the Sn atoms in the thermal oxide film at a level C closer to the Si substrate with respect to the central level A. As a result of such a precipitation of the Sn atoms, a number of Sn nanocrystals, each having a size of about 5 nm, are formed along the foregoing $SiO_2$/Si interface.

Each of the Sn nanocrystals has a generally spherical shape and generally the same size, and the Sn nanocrystals thus formed are arranged two-dimensionally at a generally identical height as measured from the SiO$_2$/Si interface. Further, it should be noted that a lattice image is confirmed for each of the Sn nanocrystals.

Figure 5:
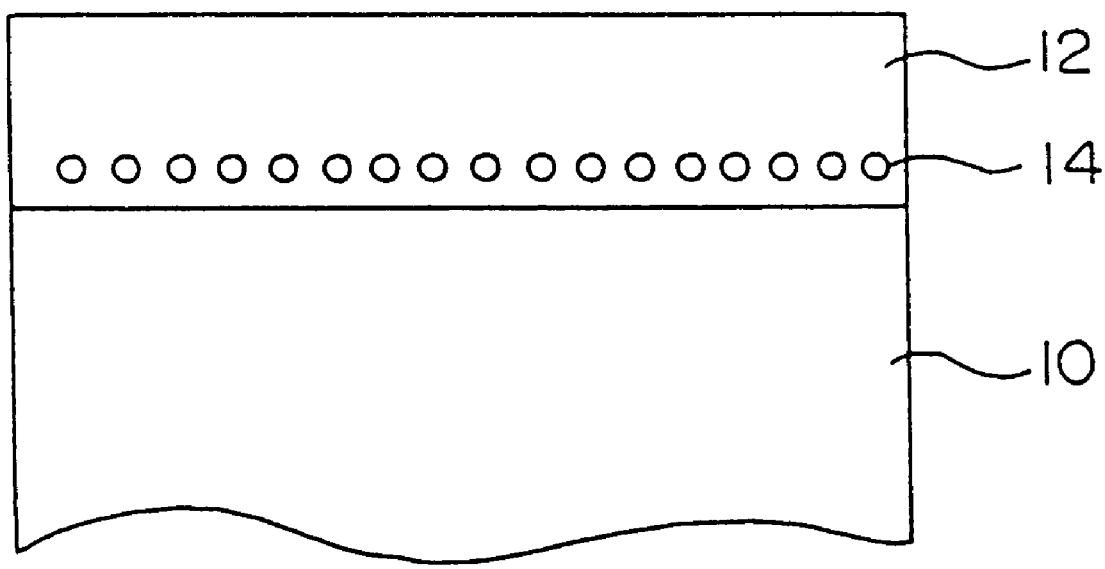
FIG. 5 is another diagram explaining the principle of the present invention.

FIG. 5 shows the structure of FIG. 4 schematically.

Referring to FIG. 5, a degenerate Si substrate 10 of the n+-type carries thereon an SiO$_2$ film 12 formed by a thermal oxidation process with a thickness of 5–40 nm, and Sn ultra-fine particles 14 having a diameter of about 5 nm and corresponding to the Sn nanocrystals, are formed in the SiO$_2$ film 12 along an interface to the Si substrate 10 generally at a constant height as measured from the foregoing interface, with a generally constant mutual separation. As can be seen in FIG. 5, the Sn ultra-fine particles 14 are arranged generally two-dimensionally in the SiO$_2$ film 12 at a level corresponding to the level B of FIG. 2 or level C of FIG. 4, which is closer to the foregoing interface with respect to the central level A of the SiO$_2$ film 12 in the thickness direction.

Thus, the present invention provides a single-electron device that uses such metal nanocrystals, arranged two-dimensionally in an insulating film along an interface between the insulating film and a substrate, for the active part of the single-electron device.

[FIRST EMBODIMENT]

FIGS. 6A–6J show a fabrication process of a single-electron device according to a first embodiment of the present invention, wherein those parts corresponding to the parts described previously are designated by the same reference numerals and the description thereof will be omitted.

Figure 6A:
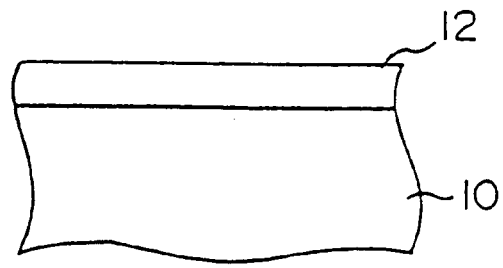

Referring to FIG. 6A, the SiO$_2$ film 12 is formed on the surface of the Si substrate 10 by a thermal oxidation process with a thickness of 5–40 nm, typically a thickness of 15 nm.

Figure 6B:
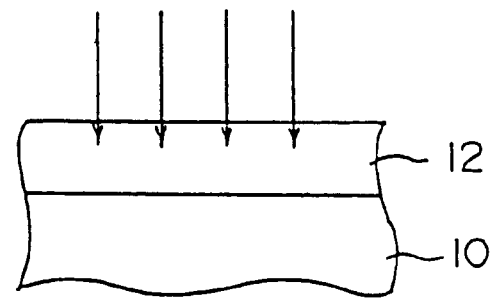

Next, in the step of FIG. 6B, an ion implantation of Sn is conducted into the SiO$_2$ film 12 under an acceleration energy of about 20 keV or less, preferably about 10 keV, with a dose of about $5 \times 10^{15}$ cm$^{-2}$. By introducing the Sn ions with such a low acceleration energy, the Sn atoms thus introduced are concentrated generally in the central part A of the SiO$_2$ film 12 as well as in the level B adjacent to the SiO$_2$/Si interface. Contrary to the conventional case in which the ion implantation is conducted with much higher acceleration energy such as 160 keV, no substantial Sn atoms reach the substrate 10 by crossing the SiO$_2$/Si interface.

Figure 6C:
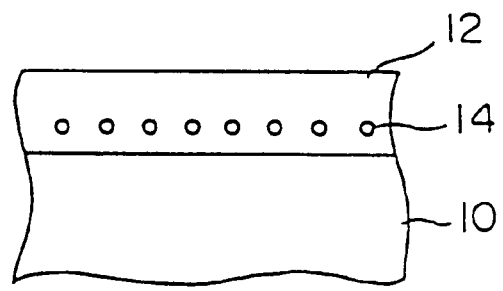

Next, in the step of FIG. 6C, the structure of FIG. 6B is subjected to a thermal annealing process conducted in an N$_2$ atmosphere at a temperature of about 900° C. for a duration of about 10 minutes. As a result of such a thermal annealing process, the Sn atoms introduced into the SiO$_2$ film 12 precipitate spontaneously to form the Sn nanocrystals 14 in the SiO$_2$ film 12 at a level corresponding to the level C of FIG. 4. The Sn nanocrystals 14 thus formed may have a diameter of typically about 5 nm and are arranged generally two-dimensionally in the SiO$_2$ film 12 at a generally constant level as measured from the SiO$_2$/Si interface.

Figure 6D:
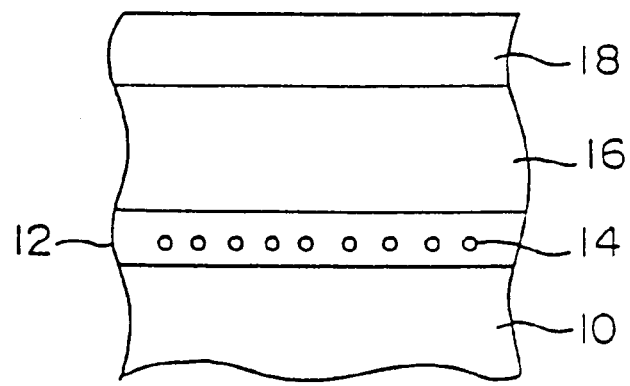

Next, in the step of FIG. 6D, the SiO$_2$ film 12 is coated with a first resist film 16 and a second resist film 18 consecutively, wherein the first resist film 16 is formed of PMMA (polymethylmethacrylate) with a thickness of about 500 nm. On the other hand, the second resist film 18 is formed of Microposit S1300-31 (trade name of SHIPLEY FAR EAST, LTD) and deposited with a thickness of about 300 nm.

Next, in the step of FIG. 6E, a photo-mask 20 having an opening 20A is provided on the resist film 18 of FIG. 6D, and an exposure of the resist film 18 is conducted through the foregoing opening 20A.

Next, in the step of FIG. 6F, the exposed region 22 is removed selectively by applying a developing process, followed by the step of FIG. 6G, in which the underlying resist film 16 is exposed by an ultraviolet radiation.

Figure 6I:
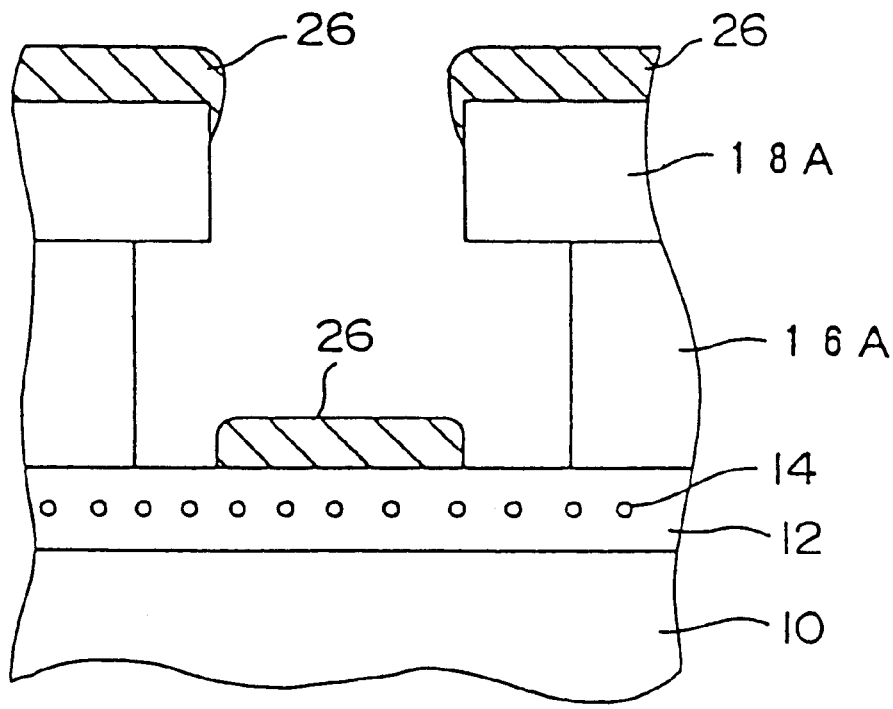

After development of the resist film 16 in the step of FIG. 6G, the region 24 of the resist film 16 is removed, and the resist film 16 thus developed forms a resist pattern 16A. Further, the step of FIG. 6I is conducted in which a conductive film 26 typically of Al or an Al alloy is deposited on the structure of FIG. 6G while using the resist patterns 16A and 18A as a mask.

Figure 6J:
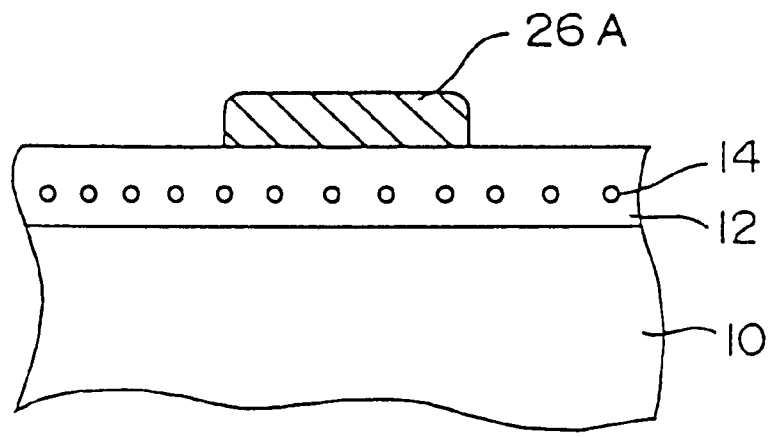

Further, by lifting off the conductive film 26 on the resist patterns 16A and 18A in the step of FIG. 6J, an electrode pattern 26A is formed on the SiO$_2$ film 12, in which Sn nanocrystals 14 are formed.

Figure 7:
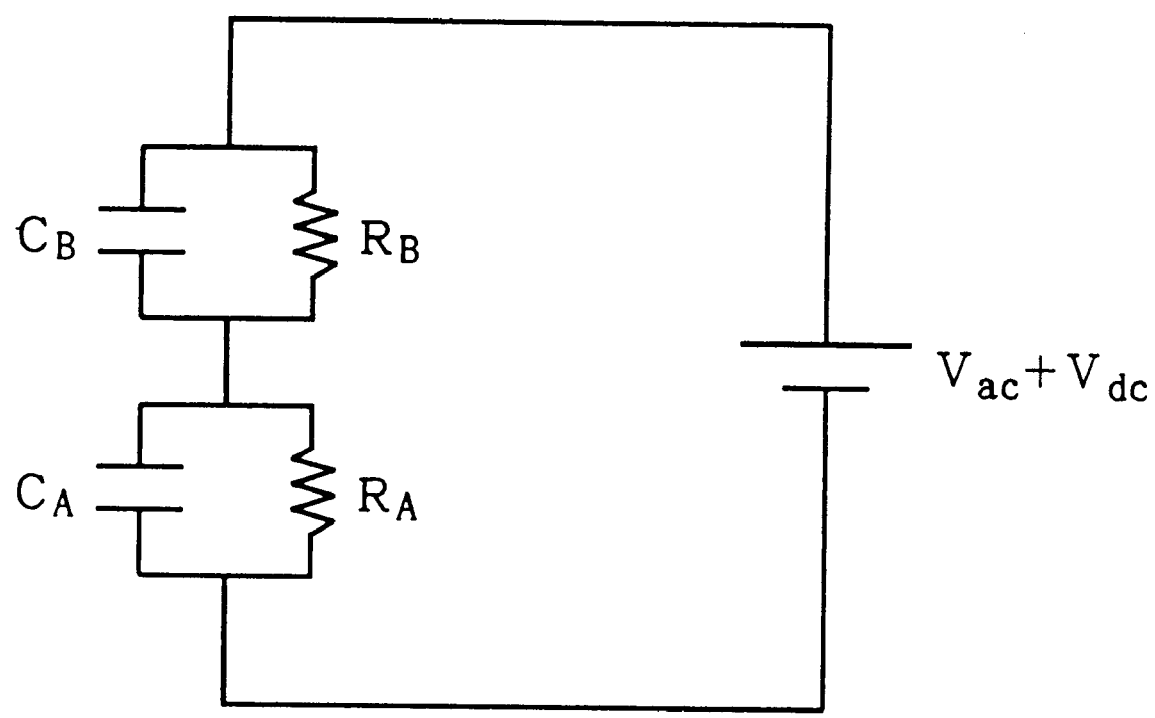
FIG. 7 is a circuit diagram showing the equivalent circuit of the single-electron tunneling diode of the first embodiment.

It should be noted that the structure of FIG. 6J functions as a single-electron diode having an equivalent circuit diagram shown in FIG. 7.

Referring to FIG. 7, the single-electron tunnel diode of FIG. 6J has a construction in which a capacitance $C_A$ formed between the Si substrate 10 and the Sn nanocrystals 14 and a capacitance $C_B$ formed between the Sn nanocrystals 14 and the electrode pattern 26A are connected in series. Further, tunnel resistances $R_A$ and $R_B$ are connected parallel to the capacitance $C_A$ and $C_B$ respectively.

Figure 8:
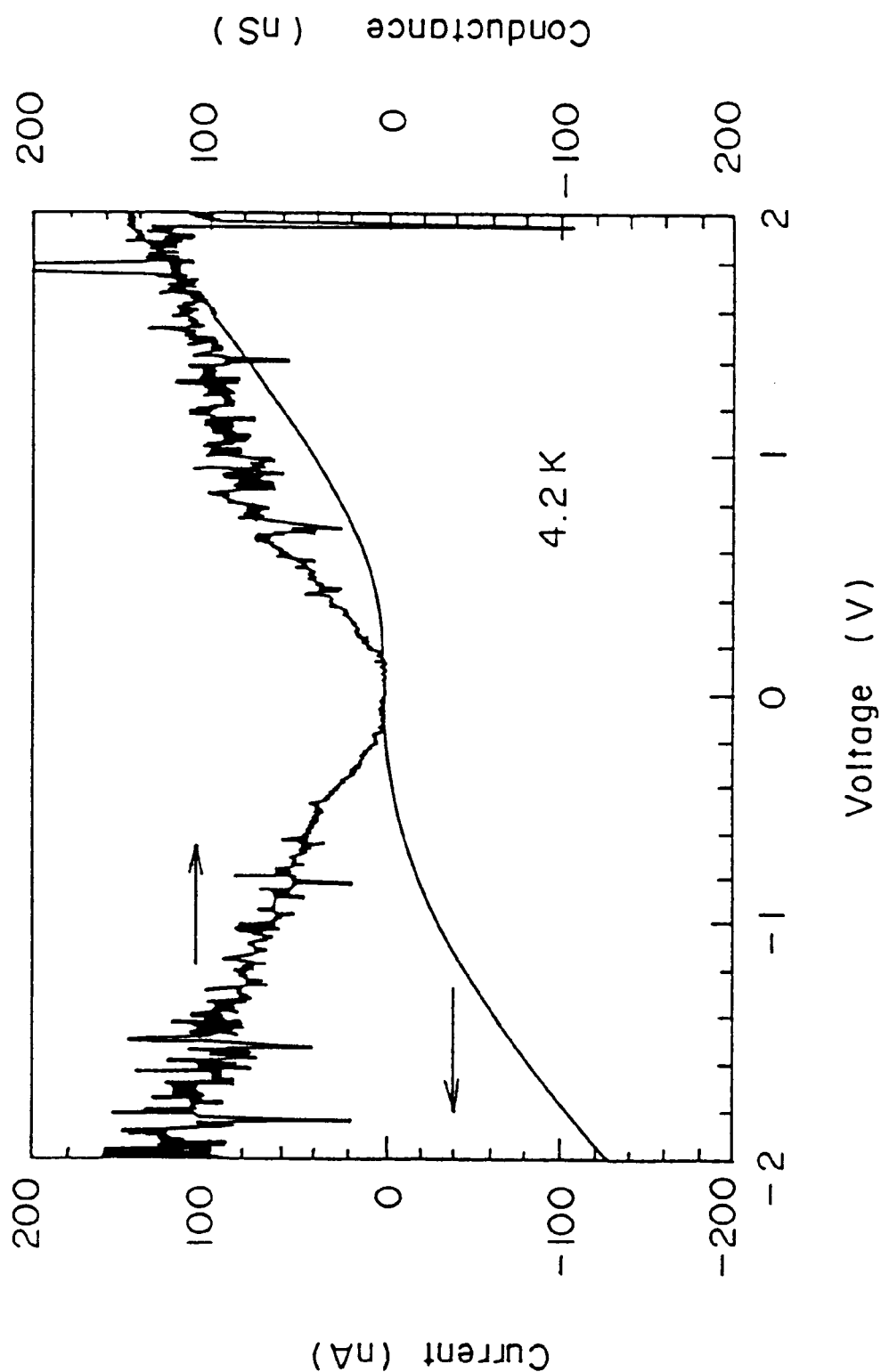
FIG. 8 is a diagram showing the operational characteristics of the single-electron tunneling diode of the first embodiment of the present invention.

FIG. 8 shows the operational characteristics of the single-electron diode of FIG. 6J for a case in which the thickness of the SiO$_2$ film 12 is set to about 10 nm, wherein the horizontal axis of FIG. 8 represents the voltage applied across the substrate 10 and the electrode pattern 26A, while the vertical axis at the left represents the current flowing through the single-electron diode. Further, the vertical axis at the right indicates the conductance.

Referring to FIG. 8, the current-voltage characteristic of the single-electron diode shows a blockage region of the current explained previously with reference to FIG. 1B. Further, the conductance of the single-electron diode exhibits a clear variation with applied voltage, particularly a blockage region around the zero voltage.

It should be noted that various logic circuits and memory circuits can be formed by using such single-electron diodes or single-electron transistors, which include a gate electrode further in the single-electron diode.

It should be noted that the metal elements introduced into the SiO$_2$ film by way of the ion implantation process is by no means limited to Sn, but other metal elements such as Cu, Fe, Ag, Au, Pt, In and Ga may also be used. Even when using these additional metal elements, it is necessary to set the acceleration energy of ion implantation such that the distribution of the introduced metal elements is sharp and is limited within the SiO$_2$ film immediately after the ion implantation process.

It is also possible to use other insulating film such as an SiN film in place of the SiO$_2$ film 12.

In the thermal annealing process of FIG. 6C, it is preferable to cause a diffusion of the introduced Sn atoms at a temperature of about 900° C. such that the Sn atoms precipitate spontaneously. Generally, such a thermal annealing process should be conducted at a temperature of at least about 400° C.

[SECOND EMBODIMENT]

In the previous embodiment, the metal nanocrystals are formed successfully in an insulating film provided on a substrate by way of ion implantation of Sn or other metal elements by optimizing the acceleration energy. These metal elements, however, are not used commonly in conventional fabrication process of semiconductor devices, particularly in the process steps that are conducted prior to a high temperature heat treatment process. The use of these metal elements has been limited in the final step of forming interconnection patterns.

In the process of forming the metal nanocrystals, a high temperature annealing process conducted at a temperature such as 900° C. is indispensable as explained previously. However, such a high temperature annealing process conducted on the system that includes metal elements, may cause a contamination of production line when the foregoing process is carried out in a conventional production line designed for producing conventional semiconductor devices. It should be noted that the predominant concentration of Sn ions at the level A observed in the TEM photograph of FIG. 2 has disappeared in the TEM photograph of FIG. 4, which shows the state after the high temperature annealing process. This may indicate that a substantial amount of Sn atoms have escaped away from the free surface of the $SiO_2$ film during such a high temperature annealing process.

In view of the circumstances noted above, the inventors of the present invention have conducted an experimental study to form conductive nanocrystals in an insulating film while using elements that are used commonly in conventional fabrication process of semiconductor devices.

While the candidate elements for this experiment include As and P, it is already known that the ultra-fine particles of As or P dispersed in an insulating film are amorphous in phase and do not form nanocrystals. When the ultra-fine particles in the insulating film is in amorphous phase, the existence of defects seriously deteriorates the performance of the single-electron device thus formed.

On the other hand, the inventor of the present invention have discovered that metal nanocrystals are formed successfully in an insulating film when Sb is used for the metal element.

Hereinafter, the experiment conducted by the inventor will be described.

In the experiment, an $SiO_2$ film is formed on a Si substrate by a thermal oxidation process similarly to the process of FIG. 6A with a thickness of about 500 nm, followed by an ion implantation process of Sb+ conducted in correspondence to the ion implantation process of FIG. 6B, under an acceleration voltage of 40 keV and with a dose of $1 \times 10^{16}$ $cm^{-2}$. The acceleration voltage is set such that the Sb+ ions thus introduced into the $SiO_2$ film do not reach the substrate. The structure thus formed is then subjected to a thermal annealing process in correspondence to the step of FIG. 6C at a temperature of 900° C. for about 10 minutes.

Figure 9A:
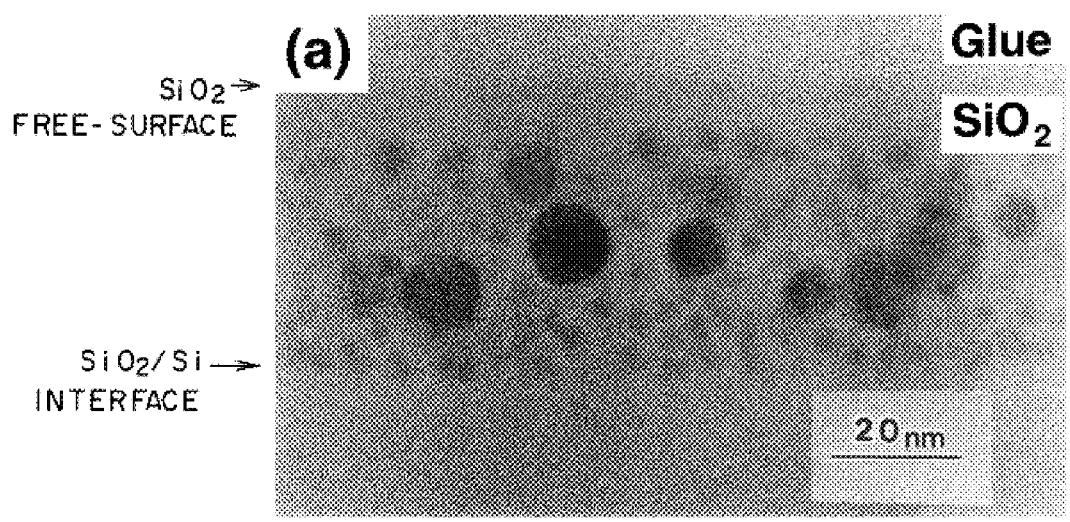
FIGS. 9A and 9B are diagrams showing Sb nanocrystals according to a second embodiment of the present invention.

FIG. 9A shows the TEM photograph of an Sb nanocrystal thus formed.

Referring to FIG. 9A, it can be seen that the Sb particles in the $SiO_2$ film has a generally spherical shape with a diameter of about 5–15 nm and are distributed with a mutual separation. The Sb ultra-fine particles thus formed show a lattice image, indicating that the Sb ultra-fine particles indeed form nanocrystals.

Figure 9B:
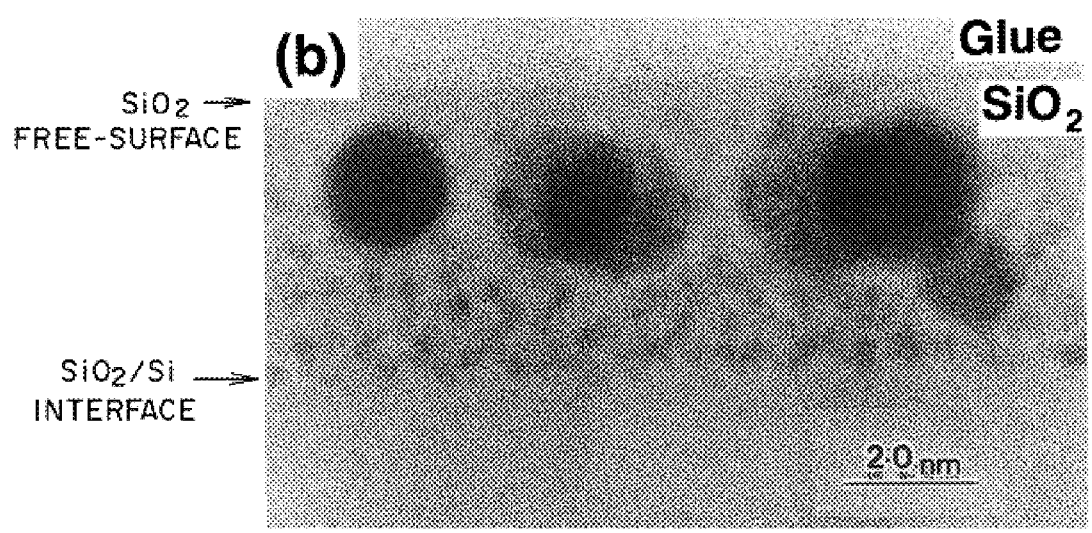

FIG. 9B shows the TEM photograph of the Sb nanocrystals formed by increasing the dose to $1 \times 10^{17} cm^{-2}$ while maintaining the foregoing acceleration energy of 40 keV. As can be seen clearly from FIG. 9B, the diameter of the Sb nanocrystals formed in the $SiO_2$ film is increased to about 25 nm by increasing the dose as such.

Thus, the present embodiment enables successful formation of nanocrystals of Sb in an insulating film by way of an ion implantation process of Sb, by using a well established ion implantation technology using in the conventional fabrication process of semiconductor devices. Thereby, the cost of the single-electron devices is reduced substantially.

Further, the size of the Sb nanocrystals can be changed as desired by changing the dose of the Sb ion implantation in the range of $1 \times 10^{13}$ $cm^{-2}$ or more, including the foregoing dose of $1 \times 10^{16}$ $cm^{-2}$ or $1 \times 10^{17}$ $cm^{-2}$.

In the embodiments described heretofore, the incorporation of the metal elements into the insulating film has been achieved by using an ion implantation process. However, the incorporation of the metal elements into the insulating film is not limited to the ion implantation process but other processes may also be possible. For example, the metal elements may be incorporated as dopant when forming the insulating film by a CVD process.

[THIRD EMBODIMENT]

Figure 1A:
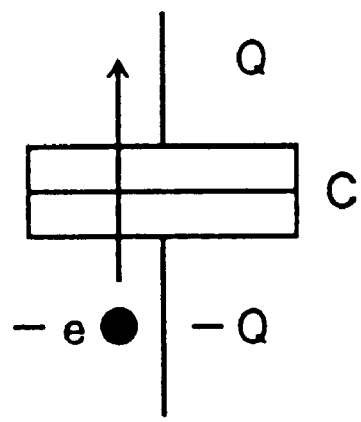
FIGS. 1A and 1B are diagrams explaining a basic component of single electron devices and its principle.
Figure 1B:
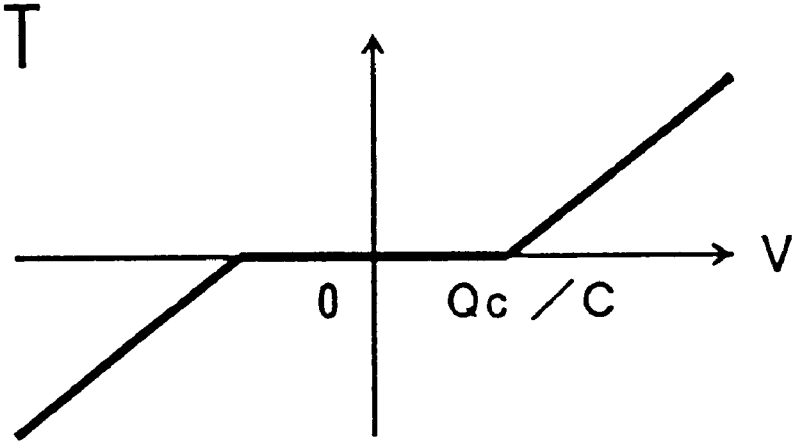
Figure 10A:
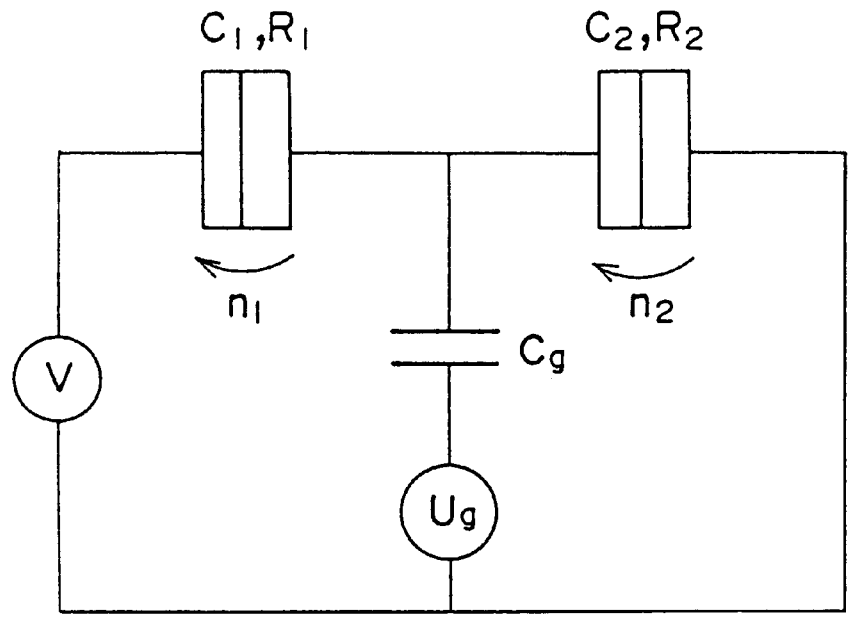
FIGS. 10A and 10B are diagrams showing an equivalent circuit diagram and operational characteristics of a single-electron transistor according to a third embodiment of the present invention.
Figure 10B:
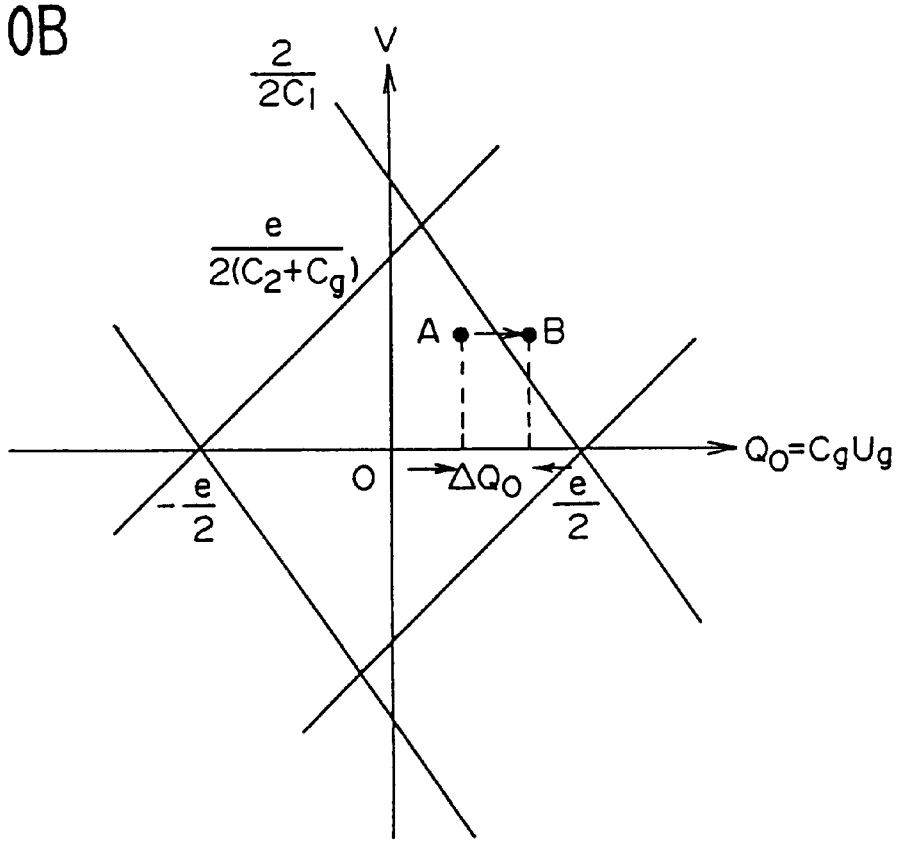

FIGS. 10A and 10B show respectively an equivalent circuit diagram and an operational characteristic of a single-electron transistor 30 according to a third embodiment of the present invention. The single-electron transistor 30 has a construction in which two of the basic components of FIG. 1A are connected in series and a gate electrode is provided further.

Referring to the equivalent circuit diagram of FIG. 10A, a first tunnel junction, formed between the substrate 10 and the Sn nanocrystals 14 in the construction of FIG. 6J and having a capacitance $C_1$ and a tunneling resistance $R_1$, is connected in series to a second tunnel junction formed between the Sn nanocrystals 14 and the Al electrode pattern 26A, wherein the second tunnel junction has a capacitance $C_2$ and a tunneling resistance $R_2$.

In operation, a bias voltage V is applied across the series connection of the first and second tunnel junctions, and a voltage signal $U_g$ is supplied to an intermediate node between the first tunnel junction and the second tunnel junction via a capacitor $C_g$.

In the single-electron transistor 30 of FIG. 10A, a Coulomb blockade appears in the parallelogram region defined in FIG. 10B by two pairs of parallel lines passing through the points $-e/2$ and $e/2$, and no electric current flows through the transistor 30 as long as the operational point is located at a point A inside the parallelogram. When, on the other hand, the operational point has moved from the point A to a point B across the border of the parallelogram in response to the signal voltage $U_g$, a single electron passes consecutively through the first tunnel junction and the second tunnel junction connected in series.

Figure 11:
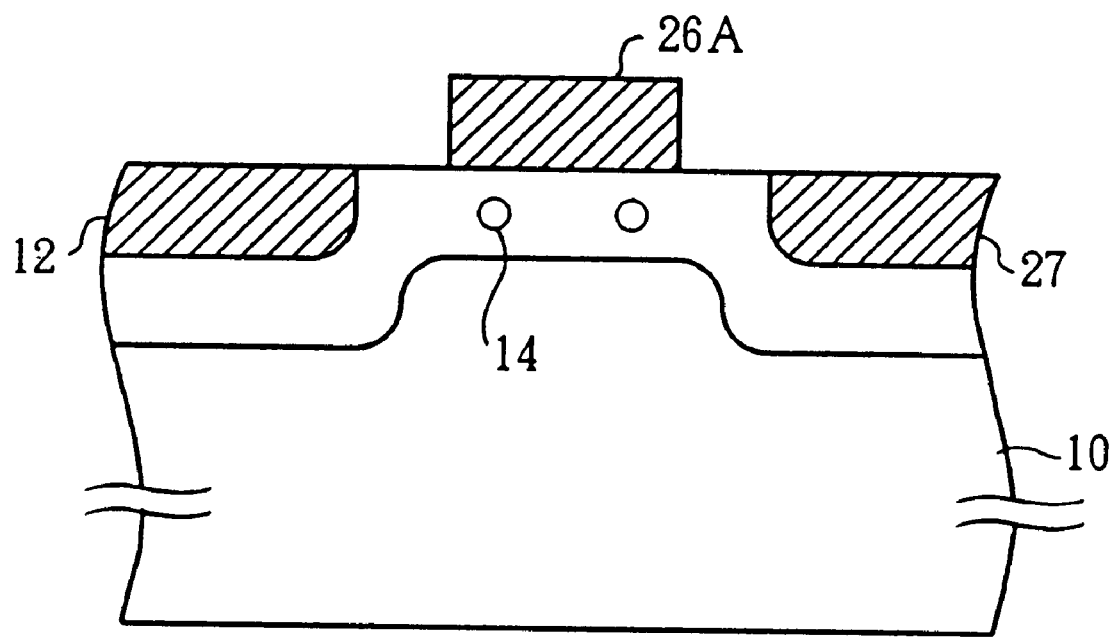
FIG. 11 is a diagram showing the construction the single-electron transistor of the third embodiment.

FIG. 11 shows the construction of a single-electron transistor 30 corresponding to the equivalent circuit diagram of FIG. 10A, wherein those parts of FIG. 11 corresponding to the parts described previously are designated by the same reference numerals and the description thereof will be omitted.

Referring to FIG. 11, the single-electron transistor 30 has a construction similar to that of the single-electron diode of FIG. 6J except that there is provided a gate electrode 27 of Al or an Al alloy in a part of the $SiO_2$ film 12 with a separation from any of the Sn nanocrystals 14 or from the Si substrate 10. As indicated in the equivalent circuit diagram of FIG. 10A, the gate electrode 27 is supplied with the voltage signal $U_g$.

In the construction of FIG. 11, the $SiO_2$ film 12 is formed so as to fill a depression formed in a part of the substrate 10, and the gate electrode 27 is formed in the $SiO_2$ film in correspondence to the foregoing depression of the substrate 10 so as to form a capacitance coupling with the metal nanocrystals 14 via the foregoing coupling capacitance $C_g$. Of course, the single-electron transistor 30 of the present invention is not limited to such a particular construction but may have any construction as long as the gate electrode 27 achieves a capacitance coupling $C_g$ with the Sn nanocrystals 14.

[FOURTH EMBODIMENT]

Figure 12:
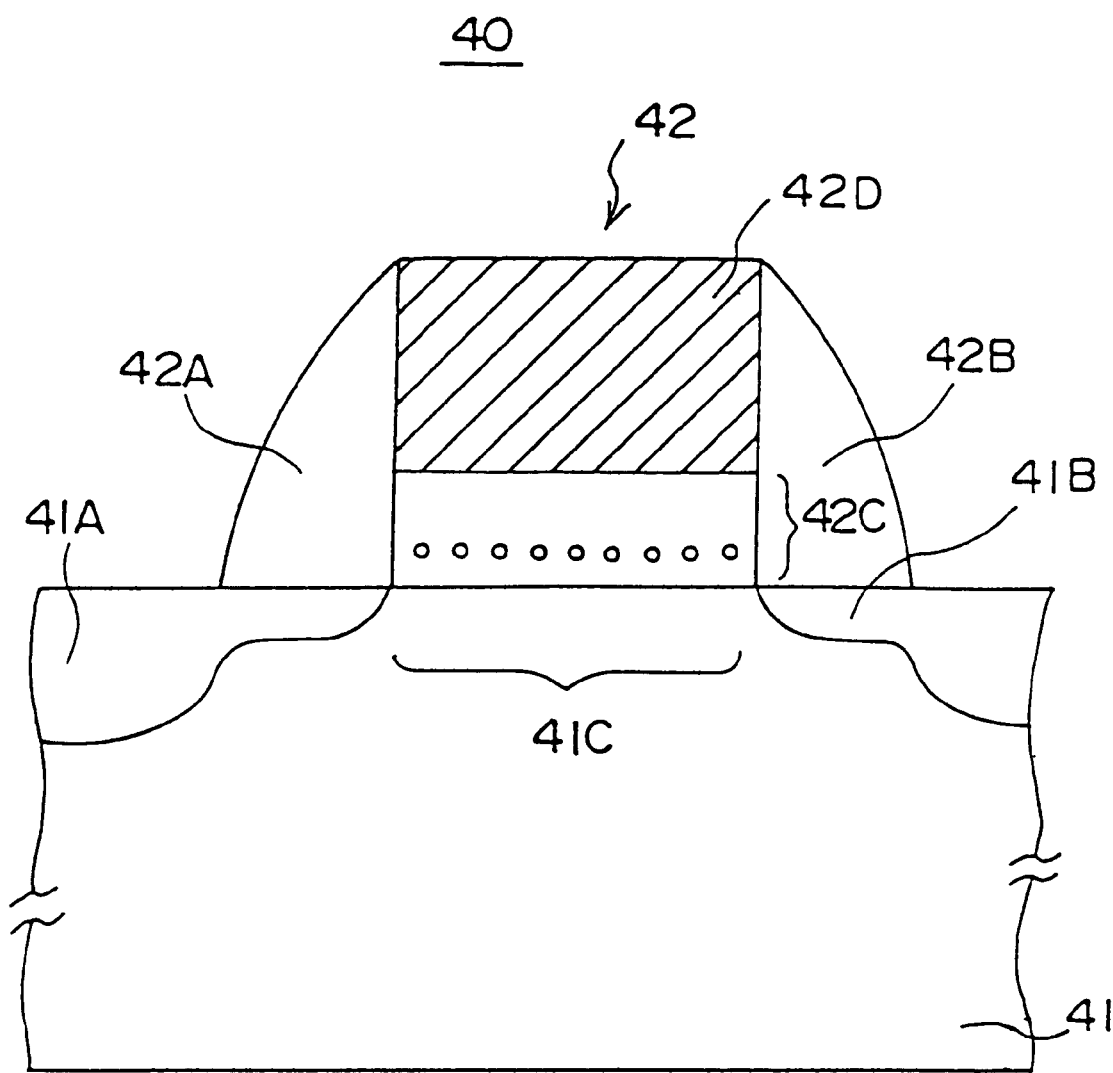
FIG. 12 is a diagram showing the construction of a single-electron flash-memory according to a fourth embodiment of the present invention.

FIG. 12 shows the construction of a flash memory 40 according to a fourth embodiment of the present invention that uses the construction of FIG. 6J.

Referring to FIG. 12, the flash memory 40 is constructed on a Si substrate 41 doped to the p-type and formed with diffusion regions 41A and 41B each having an LDD (lightly doped drain) structure respectively as the source and drain regions, and includes a gate electrode structure 42 that is formed on a part of the substrate 41 in which a channel region 41C is formed.

As indicated in FIG. 12, the gate structure 42 is defined by a pair of side walls covered by a pair of side wall insulating films 42A and 42B, and includes a floating gate structure 42C in which Sn nanocrystals are arranged generally two-dimensionally in an $SiO_2$ film and a control gate electrode 42D provided on the floating gate structure 42C.

In a write mode operation of the flash memory 40, a write control voltage is applied to the control gate electrode 42D. Thereby, an Sn nanocrystal included in the floating gate structure 42C captures an electron that is accelerated in the channel region 41C between the source electrode 41A and the drain electrode 41B and injected into the $SiO_2$ film. The electron thus captured by the Sn nanocrystal is held therein stably.

As a result of such a capturing of the electrons by the Sn nanocrystals in the floating gate structure 42C, there occurs a change in the threshold voltage of the MOS transistor that constitutes the flash memory 40, and the reading of the information thus stored in the flash memory 40 is achieved by detecting a turning-on or turning-off of the MOS transistor while applying a suitable read control voltage to the foregoing control gate electrode 42D. Further, the erasing of the stored information is achieved easily by applying an erase control voltage across the control gate electrode 42D and the substrate 41 or across the control gate electrode 42D and the source region 41A.

As the flash memory 40 of the present invention holds the electrons in the floating gate structure 42C one by one as a result of the use of the Sn nanocrystals in the floating gate structure, the flash memory 40 of FIG. 12 provides an advantageous feature of very low power consumption and correspondingly increased integration density. Further, the flash memory 40 is capable of storing multiple value information such as ternary information.

[FIFTH EMBODIMENT]

In the previous embodiments described heretofore, the nanocrystals of metal such as Sn or Sb have been formed in the thermal oxide film 12 in correspondence to the strained region that is formed in the vicinity of the interface between the Si substrate 10 and the thermal oxide film 12. On the other hand, such a construction lacks the freedom of designing the distance between the metal nanocrystals 14 and the substrate 10 as desired. The distance between the metal nanocrystals and the substrate 10 is determined primarily by the material system.

In a fifth embodiment of the present invention to be described hereinafter with reference to FIGS. 13A–13D, the distance between the metal nanocrystals 14 and the substrate 10 can be set as desired. In FIGS. 13A–13D, it should be noted that those parts corresponding to the parts described previously are designated by the same reference numerals and the description thereof will be omitted.

Figure 13A:
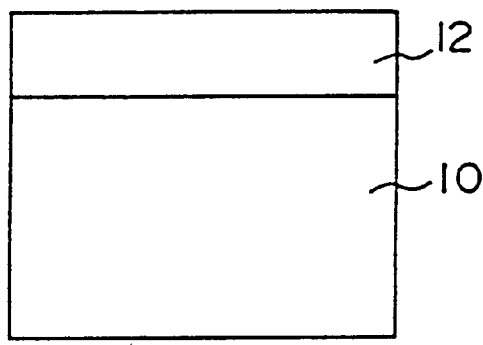
FIGS. 13A–13D are diagrams showing the fabrication process of a single-electron device according to a fifth embodiment of the present invention.

Referring to FIG. 13A, the Si substrate 10 is subjected to an organic cleaning process as well as a chemical cleaning process, followed by a thermal oxidation process to form the thermal oxide film 12 on the substrate 10 with a thickness of about 10 nm. The thermal oxidation process may be conducted at a temperature of 900–1100° C. Next, in the step of FIG. 13B, another $SiO_2$ film 52 is deposited on the thermal oxide film 12 by a plasma CVD process with a thickness of about 10 nm while using TEOS (tetraethoxy silane) and oxygen as the source materials, wherein the deposition of the CVD-$SiO_2$ film 52 may be conducted typically at the temperature of 250–400° C. Because of the difference in the temperature of formation, the thermal oxide film 12 and the CVD-$SiO_2$ film 52 have respective different densities, and there is formed a strain along the interface between the thermal oxide film 12 and the CVD-$SiO_2$ film 52.

Figure 13B:
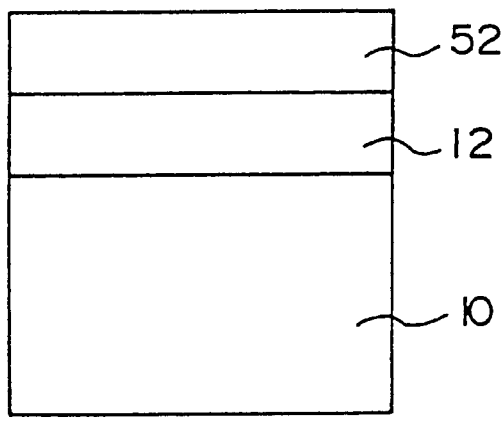
Figure 13C:
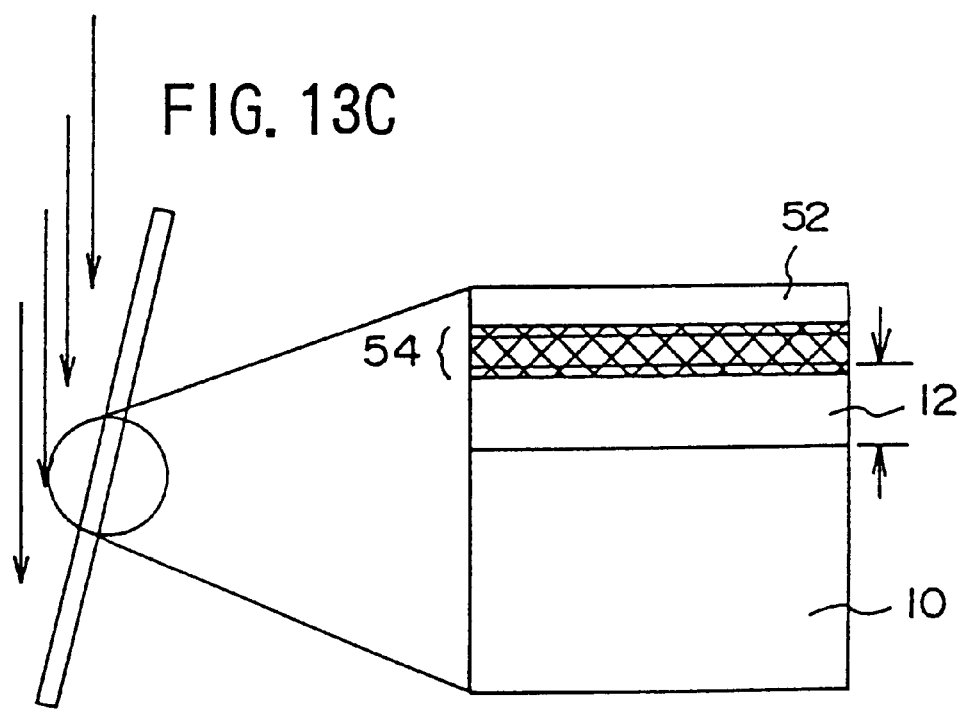

Next, in the step of FIG. 13C, an ion implantation of Sn atoms is conducted into the structure of FIG.13B from an oblique direction while setting the acceleration energy to about 15 keV and the dose to about $5 \times 10^{15} cm^{-2}$, and the Sn ions are introduced along the interface between the thermal oxide film 12 and the CVD-$SiO_2$ film 52. In the ion implantation process of FIG. 13C, the acceleration voltage is set such that the center of the distribution profile of the Sn atoms coincide generally to the foregoing interface. By conducting the ion implantation process obliquely, typically with an incidence angle of about 60° or higher, it becomes possible to reduce the width of the Sn distribution profile in the $SiO_2$ films 12 and 52. In the example of FIG. 13C, such an oblique ion implantation is achieved by tilting the substrate 10 with respect to the incident direction of the Sn ions with an angle of about 37°, and the Sn atoms impinge upon the substrate 10 with an incidence angle of 63°.

By applying a thermal annealing process to the structure of FIG. 13C at the temperature of about 900° C. for about 10 minutes, Sn nanocrystals 56, each having a diameter of about 4+1 nm, are formed along the interface between the thermal oxide film 12 and the CVD-$SiO_2$ film 52 in alignment on a plane parallel to the interface.

Figure 13D:
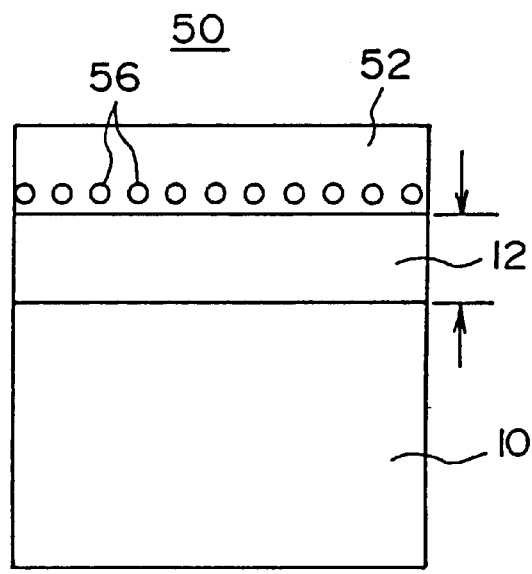

In the construction of the present embodiment, in which there exists a thermal oxide film 12 having a thickness of about 10 nm underneath the CVD-$SiO_2$ film 52, it should be noted that the Sn atoms, introduced in the step of FIG. 13C by the ion implantation process, do not reach the Si substrate 10 substantially, and the problem of formation of metal precipitates along the interface between the Si substrate 10 and the thermal oxide film 12 is effectively eliminated. Thus, the single-electron device can be fabricated with an improved yield. Further, the construction of FIG. 13D is effective for reducing the leakage, when applied to the flash memory 40 of FIG. 12, of the electric charges accumulated in the metal nanocrystals 12 to the Si substrate by way of tunneling, due to the increased distance between the metal nanocrystals 56 and the Si substrate 10.

In the present embodiment, it should be noted that the formation of the $SiO_2$ films 12 and 52 is by no means limited to the combination of thermal oxidation process and plasma-CVD process described heretofore, but other processes may also be used. For example, it is possible to form the $SiO_2$ films 12 and 52 by using a combination of any two of the thermal oxidation process, the plasma-CVD process, an optical CVD process and a thermal CVD process.

In the present embodiment, it is further possible to deposit another insulation film on the CVD-$SiO_2$ film 52 and introduce the Sn atoms into the insulation film thus formed by applying an ion implantation process. By further applying a thermal annealing process, the Sn atoms thus introduced form Sn nanocrystals aligned two-dimensionally along the interface between the CVD-$SiO_2$ film 52 and the foregoing additional insulation film deposited further thereon. Of course, the metal nanocrystals 56 of the present embodiment are by no means limited to the Sn nanocrystals but may be the nanocrystals of any of the metal elements such as Cu, Fe, Ag, Au, Sn, Pt, In, Sb and Ga.

[SIXTH EMBODIMENT]

Figure 14:
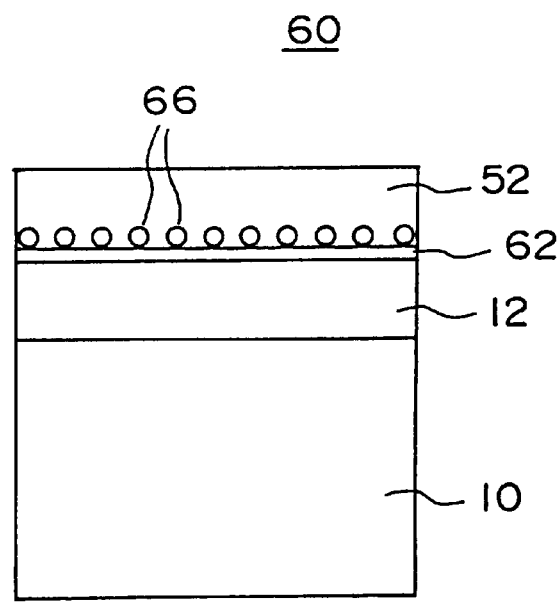
FIG. 14 is a diagram showing a single-electron device according to a sixth embodiment of the present invention.

FIG. 14 shows the construction of a single-electron device 60 according to a sixth embodiment of the present invention, wherein those parts corresponding to the parts described previously are designated by the same reference numerals and the description thereof will be omitted.

Referring to FIG. 14, an SiN film 62 is deposited on the thermal oxide film 12 of the previous embodiment with a thickness of about 5 nm by a plasma CVD process that uses ammonia and monosilane as source materials, and the CVD-$SiO_2$ film 52 is deposited further on the SiN film 62 with a thickness of about 10 nm. After the formation of the SiN film 62 and the CVD-$SiO_2$ film 52, the Sn atoms are introduced into the CVD-$SiO_2$ film 52 by an oblique ion implantation process similarly to the process of FIG. 13C, and the structure thus introduced with the Sn atoms is subjected to a thermal annealing process conducted at 900° C. for 10 minutes. As a result of the thermal annealing process, Sn nanocrystals 66 are formed along the interface between the SiN film 62 and the CVD-$SiO_2$ film 52, similarly to the Sn nanocrystals 56.

In the present embodiment, the SiN film 62 acts as a diffusion barrier of the Sn atoms thus introduced into the CVD-$SiO_2$ film 52 by the ion implantation process, and the Sn atoms cause a precipitation at the interface between the CVD-$SiO_2$ film 52 and the SiN diffusion barrier 62 to form the desired metal nanocrystals 66. The diffusion barrier 62 is of course not limited to SiN but other materials that form a strained region at the interface to an $SiO_2$ film may also be used. For example, a material of the Si—Ge—O—N system including SiON, $GeO_2$, GeN, GeON, $(Si,Ge)O_2$, $(Si,Ge)N$, and $(Si,Ge)ON$ may also be used.

Further, the present invention is not limited to the embodiments described heretofore, but various variations and modifications may be made without departing from the scope of the invention.

What is claimed is:

1. A method of fabricating a single-electron device, comprising the steps of:

introducing metal atoms into an insulating film provided on a substrate; and causing a diffusion of said metal atoms in said insulating film so as to precipitate ultra-fine metal particles having a nanometer size in said insulating film along an interface between said insulating film and said substrate in a state that said metal particles are isolated from each other;

wherein said step of introducing metal atoms is conducted such that a concentration level of said metal atoms in said insulating film is substantially zero in said substrate including said interface.

2. A method as claimed in claim 1, wherein said step of introducing metal atoms includes an ion implantation process conducted with an acceleration energy set such that a concentration of said metal atoms becomes substantially zero in said substrate including said interface and the distribution of said metal atoms becomes sharp.

3. A method as claimed in claim 2, wherein said substrate is formed of Si and wherein said insulating film is formed of $SiO_2$.

4. A method as claimed in claim 1, wherein said metal element is selected from a group consisting of Cu, Fe, Ag, Au, Sn, Pt, In, Sb and Ga.

5. A method as claimed in claim 2, wherein said metal element is Sn, and wherein said ion implantation process is conducted by setting said acceleration energy to about 20 keV or less.

6. A method as claimed in claim 2, wherein said metal element is Sb, and wherein said ion implantation process is conducted under an acceleration energy of about 40 keV or less, by setting a dose of Sb to about $1 \times 10^{13}$ cm$^{-2}$ or more.

7. A method as claimed in claim 6, wherein said ion implantation process is conducted by setting said dose of Sb to about $1 \times 10^{16}$ cm$^{-2}$.

8. A method as claimed in claim 6, wherein said ion implantation process is conducted by setting said dose of Sb to about $1 \times 10^{17}$ cm$^{-2}$ or more.

9. A method as claimed in claim 1, wherein said step of causing a diffusion in said metal atoms includes a thermal annealing process conducted at a temperature of about 400° C. or more.

10. A method as claimed in claim 1, wherein said insulating film includes a first insulating film and a second insulating film stacked with each other, and wherein said step of introducing said metal atoms is conducted such that said metal atoms are concentrated at an interface between said first insulating film and said second insulating film.

11. A method as claimed in claim 10, wherein said first and second insulating films are formed at respective different temperatures.

12. A method as claimed in claim 10, wherein said first and second insulating films have respective, different compositions.

13. A method as claimed in claim 2, wherein said ion implantation process is conducted obliquely to said substrate.

* * * * *

UNITED STATES PATENT AND TRADEMARK OFFICE
CERTIFICATE OF CORRECTION

PATENT NO. : 6,054,349
DATED : April 25, 2000
INVENTOR(S) : Nakajima, et al.

It is certified that error appears in the above-identified patent and that said Letters Patent is hereby corrected as shown below:

<u>Title page,</u>
Add the following:
Foreign Application Priority Data

Nov. 10, 1997  [JP]    Japan................ 9-306908

Signed and Sealed this

Sixth Day of November, 2001

Attest:

*Nicholas P. Godici*

NICHOLAS P. GODICI
*Attesting Officer      Acting Director of the United States Patent and Trademark Office*